United States Patent [19]
Toriyama

[11] Patent Number: 5,708,294
[45] Date of Patent: Jan. 13, 1998

[54] LEAD FRAME HAVING OBLIQUE SLITS ON A DIE PAD

[75] Inventor: Keiji Toriyama, Tokyo, Japan

[73] Assignee: NEC Corporation, Japan

[21] Appl. No.: 605,497

[22] Filed: Feb. 26, 1996

[30] Foreign Application Priority Data

Feb. 28, 1995 [JP] Japan .................... 7-040217

[51] Int. Cl.[6] .................................................. H01L 23/495
[52] U.S. Cl. .................................... 257/676; 257/667
[58] Field of Search ............................ 257/676, 667

[56] References Cited

FOREIGN PATENT DOCUMENTS

| 293970 | 12/1988 | European Pat. Off. | 257/676 |
|---|---|---|---|
| 60-42735 | 3/1985 | Japan | H01L 21/58 |
| 61-16555 | 1/1986 | Japan | 257/676 |
| 62-137859 | 6/1987 | Japan | H01L 23/48 |
| 1-130556 | 9/1989 | Japan | H01L 23/50 |
| 2-117164 | 5/1990 | Japan | 257/676 |
| 2-125651 | 5/1990 | Japan | H01L 23/50 |
| 5-82706 | 4/1993 | Japan | 257/676 |

*Primary Examiner*—Mahshid D. Saadat
*Assistant Examiner*—T. M. Arroyo
*Attorney, Agent, or Firm*—Hayes, Soloway, Hennessey, Grossman & Hage, P.C.

[57] ABSTRACT

A lead frame has a frame section for carriage, a square die pad for mounting a semiconductor chip, and four suspension arms bridging the frame section and corners of the die pad. The die pad has a plurality of oblique slits therein extending parallel to one another and parallel to a diagonal line of the die pad passing first and second corners of the die pad. During encapsulation, resin is introduced from a gate of molding dies located at the first corner to a vent of the molding dies located at the second corner. The oblique slits enhances oblique resin-flow under the lower surface of the die pad during encapsulation of the semiconductor device, to thereby prevent a die pad shift, unfilling of the resin and resin void in the semiconductor device.

3 Claims, 4 Drawing Sheets

FIG. I
(PRIOR ART)

LEAD FRAME HAVING OBLIQUE SLITS ON A DIE PAD

BACKGROUND OF THE INVENTION (a) Field of the Invention

The present invention relates to a lead frame and, more particularly, to a lead frame for use in a resin encapsulated semiconductor device and having a plurality of slits in the die pad thereof.

(b) Description of the Related Art

A resin encapsulated semiconductor device includes a lead frame for fixing a semiconductor chip on an island section or die pad of the lead frame. The lead frame is generally formed of a metallic thin plate having a pattern formed by an etching or press technique. Bonding wires are provided for bonding pads of the semiconductor chip to external pins of the semiconductor device through a plurality of leads included in the lead frame.

FIG. 1 shows a conventional lead frame for use in a resin encapsulated semiconductor device. The conventional lead frame 10 is formed of a metallic plate pattern and includes frame section 15 for conveyance of the lead frame, die pad or island section 11 for mounting a semiconductor chip thereon, four suspension arms 12 for supporting the die pad 11, and a plurality of electric leads 13 for the semiconductor chip.

The frame section 15 includes a pair of side frame portions 15A extending parallel to each other at both lateral sides of the lead frame 10 and a pair of inner portions 15B bridging the pair of side frame portions 15A together. The frame section 15 maintains the structure of the whole lead frame 10 while acting as a carriage to be held and carried during conveyance of the lead frame 10. The die pad 11 is located within a central aperture of the frame section 15 defined by inner edges of the side portions 15A and the inner portions 15B, and mounts a semiconductor chip 19 at the central portion of the die pad 11 designated by chain lines in the drawing.

Four suspension arms 12 are provided for respective corners of the rectangular or square die pad 11 to bridge the frame section 15 and the die pad 11 at the corners of the die pad 11 so as to support the same. The plurality of electric leads 13 have respective tips opposed to the periphery of the die pad 11 and extend outwardly towards the outer periphery of the lead frame 10. Tie bars 14 are provided to support the electric leads 13 together for fixing the same.

FIG. 2 shows a resin encapsulated semiconductor device including the lead frame 10 as described above during encapsulation thereof. A semiconductor chip 19 is bonded onto the die pad 11 of the lead frame 10 by using silver paste, following which pads on the semiconductor chip 19 are connected to the respective tips of the electric leads by using a wire bonding technique utilizing gold wires, for example. The lead frame 10 supporting the semiconductor chip 19 is fixedly sandwiched between upper and lower molding dies 20, then resin 21 is injected through a gate or inlet 16 of the molding dies 20 into a cavity 24 defined between the upper and lower molding dies 20. At this time, the resin 21 flows along both the upper surface and the lower surface of the lead frame 10, as shown by arrows, so as to fill the cavity 24 defined between the upper and lower molding dies 20. The resin 21 is then cured and hence the semiconductor chip 19 is encapsulated with the resin. Thereafter, molding dies 20 are separated from the resultant semiconductor device, then side frame portions 15A, electric leads 13 and suspension arms 12 of the lead frame 10 are cut at predetermined positions to obtain a semiconductor device.

In the semiconductor device including the conventional lead frame 10 as described above, thermal stress occurs between the semiconductor chip 19 and the die pad 11 when these elements are heated in a subsequent process, because the lead frame 10, semiconductor chip 19, silver paste, and resin 21 have respective thermal expansion coefficients which significantly differ from one another. This may result in the semiconductor chip 19 separating from the die pad 11 in some cases.

Some improved lead frames have been proposed to overcome the above drawback of the thermal stress, as disclosed in Utilily Model Publication Nos. JM-A-1985-42735 and JM-A-1989-130556 and Patent Publication Nos. JP-A-1987-137859 and JP-A-1990-125851. FIG. 3 shows a bottom surface of an example of the die pads in the improved lead frames, in which a plurality of slits 22 are formed in the die pad 11 in parallel to the sides thereof so as to improve adhesion between the semiconductor chip and the die pad 11, as well as to reduce thermal stress acting therebetween.

In the field of the resin encapsulated semiconductor device, a thinner package has been desired and developed, with the recent tendency of miniturization of electronic apparatuses. However, such a semiconductor device having a thinner package and the improved lead frame has also a problem in that improper encapsulation is generated due to a die pad shift, unfilling of resin, and resin voids which occur during resin encapsulation, as will be detailed later.

SUMMARY OF THE INVENTION

In view of the foregoing, it is an object of the present invention to provide a lead frame capable of reducing unbalance between the resin-flows along the upper surface of the lead frame and along the lower surface of the lead frame, thereby providing a highly reliable semiconductor device having a reduced thermal stress and an improved adhesion, in which unfilling of resin and generation of resin voids due to a die pad shift can be reduced.

The present invention provides a lead frame, for use in a semiconductor device, comprising a frame section, a die pad, supported by the frame section, for fixing a semiconductor chip on the die pad, the die pad being of a substantially rectangular shape and having a plurality of oblique slits therein extending substantially parallel to one another and to diagonal line of the die pad.

In accordance with the present invention, the direction of the plurality of oblique slits extending parallel to a diagonal line of the die pad can be aligned with resin-flow during encapsulation of the semiconductor chip. The alignment of the direction can enhance a smooth resin-flow along the lower surface of the lead frame during the encapsulation, so that it is possible to reduce an unbalance between the resin-flows, whereby die pad shift can be prevented and hence defects such as unfilling of resin and generation of resin voids due to the die pad shift can be prevented. The oblique slits can also reduce thermal stress acting between the die pad and the semiconductor chip while improving adhesion therebetween.

As a result, the present invention is capable of providing a highly reliable resin encapsulated semiconductor device.

The above and other objects, features and advantages of the present invention will be more apparent from the following description.

DESCRIPTION OF THE PREFERRED EMBODIMENT

Before, describing preferred embodiment of the present invention, disadvantages of the prior art will be described for the sake of understanding of the present invention.

Figure 2:
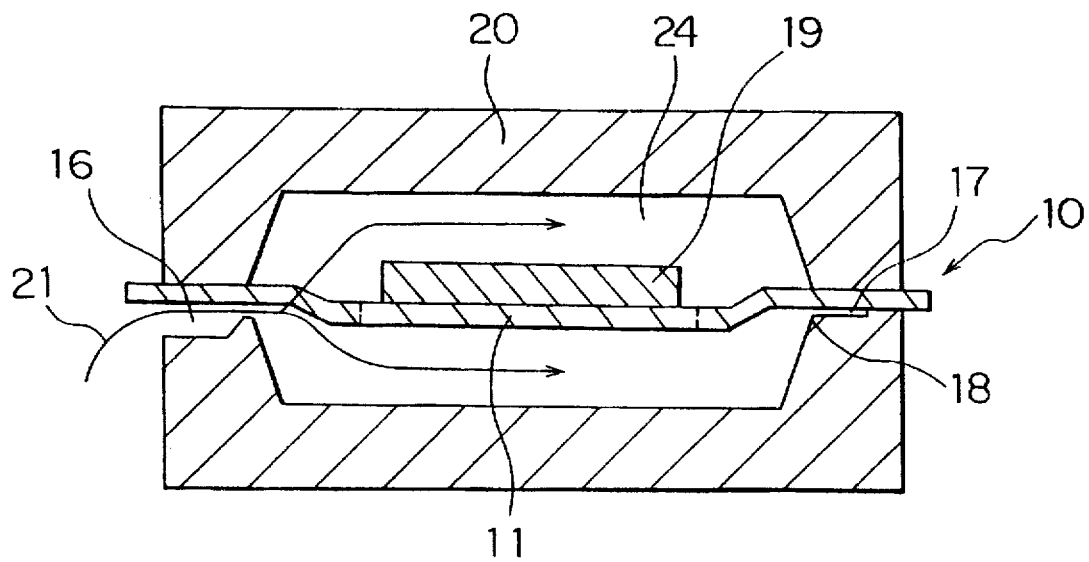
FIG. 2 is a cross sectional view taken along line 2—2 in FIG. 1 during encapsulation of a semiconductor device including the lead frame of FIG. 1.

In general, it is required in the thinner type semiconductor package as mentioned before that the thickness of the lead frame 10 be at least 150 µm, the thickness of the semiconductor chip 19 be at least 300 µm, the leap height of the bonding wire from the lead frame 10 be at least 200 µm, and the clearance between the bonding wire and the inner surface of the molding die, i.e., the upper surface of the encapsulating resin 21 be at least about 150 µm, for example. During encapsulation of the thinner type semiconductor package, as shown in FIG. 2, resin 21 is injected through a gate 16 into the cavity defined between the upper and lower molding dies 20.

Assuming that the resin encapsulated semiconductor device has a resin thickness of 1.0 mm, for example, only a clearance of 200 µm (1,000−150−300−200−150) can be provided between the lower surface of the lead frame 10 and the inner surface of the lower molding die 20, i.e., the lower surface of the resin package. Due to the small clearance under the lower surface of the lead frame 10, a large flow resistance acts on the resin 21 when the resin 21 flows thereon. In contrast, the cavity above the upper surface of the lead frame 10 has a height of as high as 350 µm, so that the flow resistance acting on the resin 21 flowing above the lead frame 10 is significantly small compared to the flow resistance acting on the resin 21 flowing under the lead frame 10.

As a result, the cavity above the upper surface of the lead frame 10 is more rapidly filled with the resin 21 than is the cavity under the lower surface of the lead frame 10. Due to this unbalance, a die pad shift occurs in which the die pad 11 is thrusted downward by a certain amount through the pressure of the resin 21 flowing along the upper surface of the lead frame 10. As a consequence, the clearance under the lower surface of the lead frame 10 is further reduced. This causes defects under the lower surface of the lead frame 10, such as unfilling of the encapsulating resin 21 and generation of resin voids.

If the clearance above the upper surface of the lead frame 10 is made equal in size to that under the lower surface of the lead frame 10, in order to solve the above problem, another problem is encountered in which the clearance between the bonding wires and the upper surface of the encapsulating resin 21 is reduced, resulting in that the bonding wires are prone to exposure from the surface of the resin package.

Figure 3:
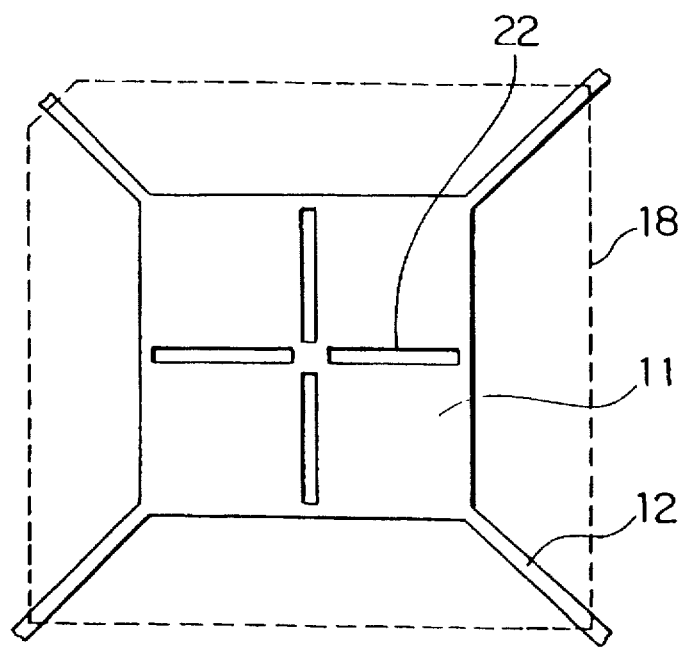
FIG. 3 is a bottom view showing another conventional lead frame having a plurality of slits formed in the die pad thereof.

In the improved lead frame as shown in FIG. 3, in which the slits 22 are formed in the die pad 11, I found another problem in that, since the slits 22 are formed so as to be parallel or perpendicular to the sides of the die pad, the directions of those slits 22 do not match the direction of the flow of the resin which is generally injected obliquely to sides of the die pad 11. That is, resin is generally injected through the gate 16 formed at the corner of the molding dies 20 along one of the suspension arms 12 and flows towards an air vent 17 located diagonal to the gate 16 along another of the suspension arms 12.

The diagonal flow of the resin 21 is resisted by the slits 22 which extend parallel to either side of the die pad 11 in a direction different from the resin-flow, and as a result, an unbalance occurs between the upper and lower resin-flows during the encapsulation. Accordingly, a die pad shift occurs, resulting in unfilling of resin and generation of resin voids, thereby reducing the reliability of the resin encapsulated semiconductor device.

Now, a preferred embodiment of the present invention will be described with reference to the drawings, in which similar elements are designated by the same reference numerals throughout the drawings.

Figure 4:
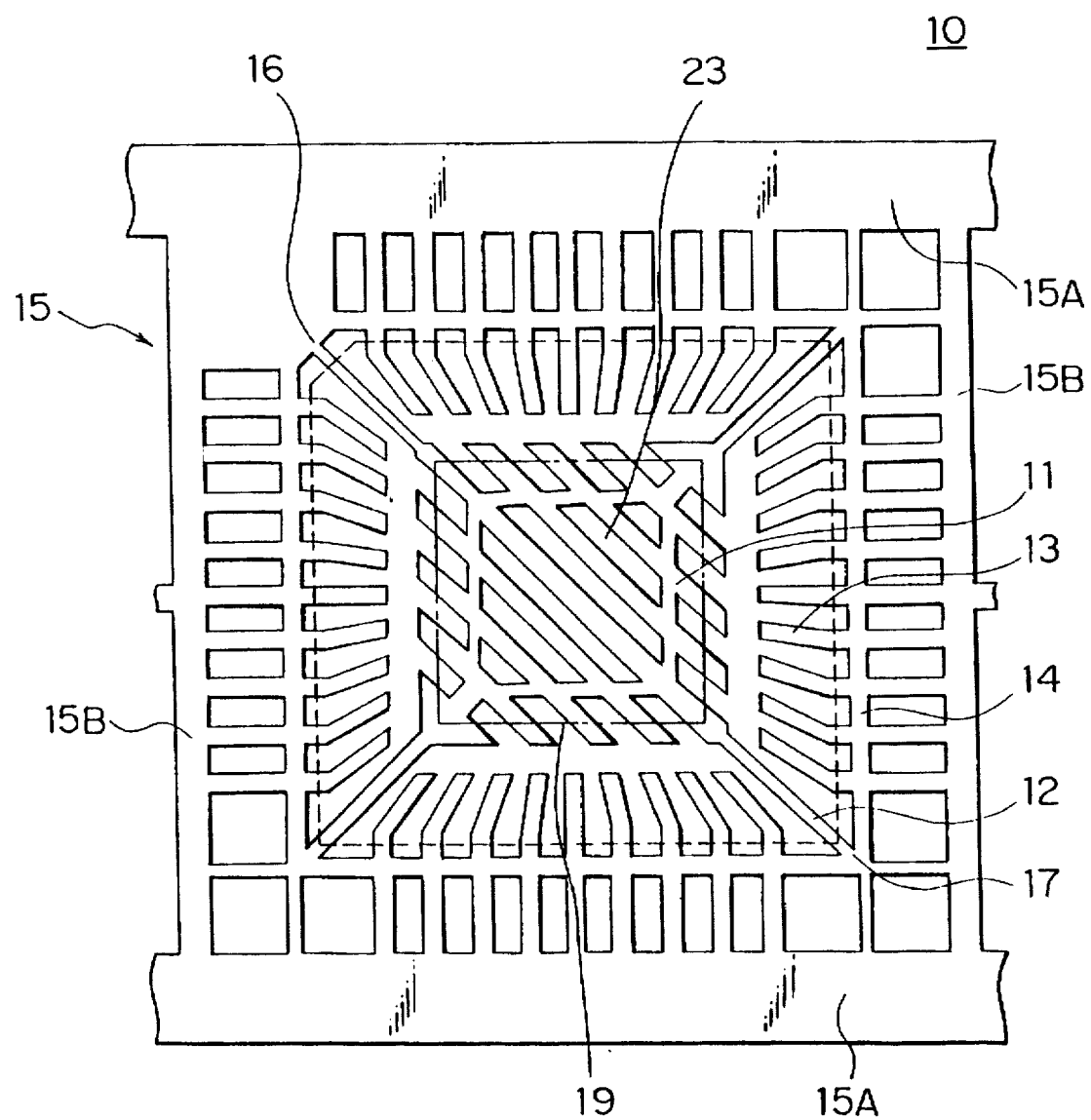
FIG. 4 is a plan view of a lead frame according to an embodiment of the present invention.

Referring to FIG. 4, a lead frame 10 according to the preferred embodiment of the present invention is formed of a metallic thin plate pattern, which has frame section 15 including a pair of side portions 15A, which are provided in parallel at both lateral sides of the lead frame 10, and a pair of inner portions 15B bridging the pair of side portions 15A. The frame section 15 maintains the structure of the whole lead frame 10 while acting as a carriage section to be held and carried during conveyance of the lead frame.

Figure 1:
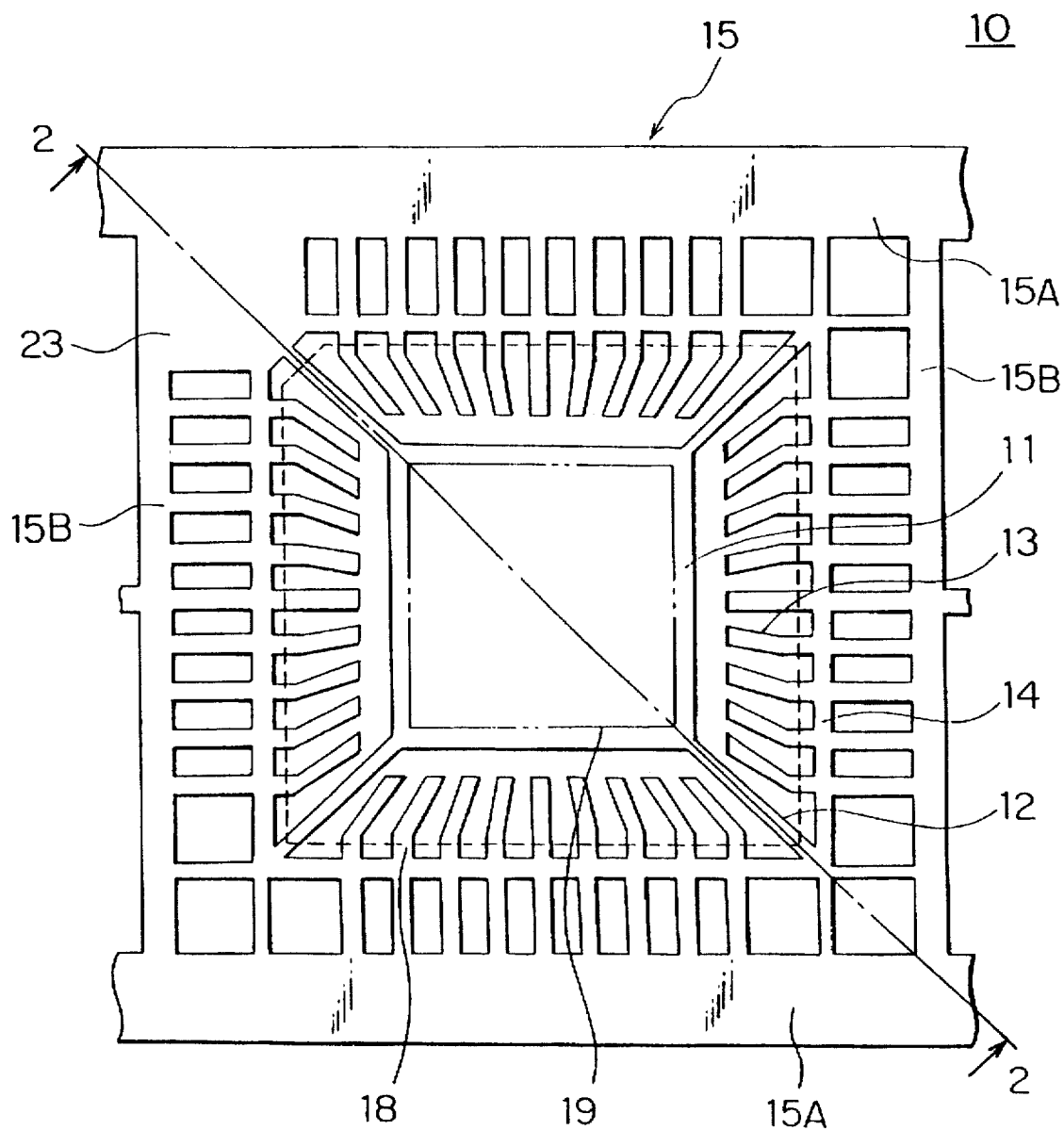
FIG. 1 is a plan view of a conventional lead frame for use in a resin encapsulated semiconductor device.

The lead frame 10 further includes a die pad 11 on which a semiconductor chip 19 is to be mounted, suspension arms 12 for supporting the die pad 11 by bridging the four corners of the square die pad 11 to the frame section 15, a plurality of electric leads 13 which have respective tips opposed to the periphery of the die pad 11 and extend outwardly towards the outer periphery of the lead frame 10, and tie bars 14 which support the electric leads 13 together. The structure as described above is similar to that of the conventional lead frame of FIG. 1.

The die pad 11 has a plurality of slits 23 formed therein and extending obliquely with respect to the sides of the die pad 11, i.e., substantially parallel to one of the diagonal lines of the square die pad 11. The diagonal line extends in a direction from one of the corners of the die pad 11, at which the gate or inlet 16 of the resin is to be located, toward another of the corners of the die pad 11 located diagonal to the one of the corners, at which a vent 17 of the resin is to be located. The gate 16 and vent 17 correspond to the locations of the respective suspension arms 12 aligned in a straight line, i.e., diagonal line of the die pad 11. The oblique slits 23 are provided to improve adhesion of the semiconductor chip and the die pad 11 as well as to effectively allow the resin to flow along the slits 23 due to the oblique direction of the slits 23.

Figure 5:
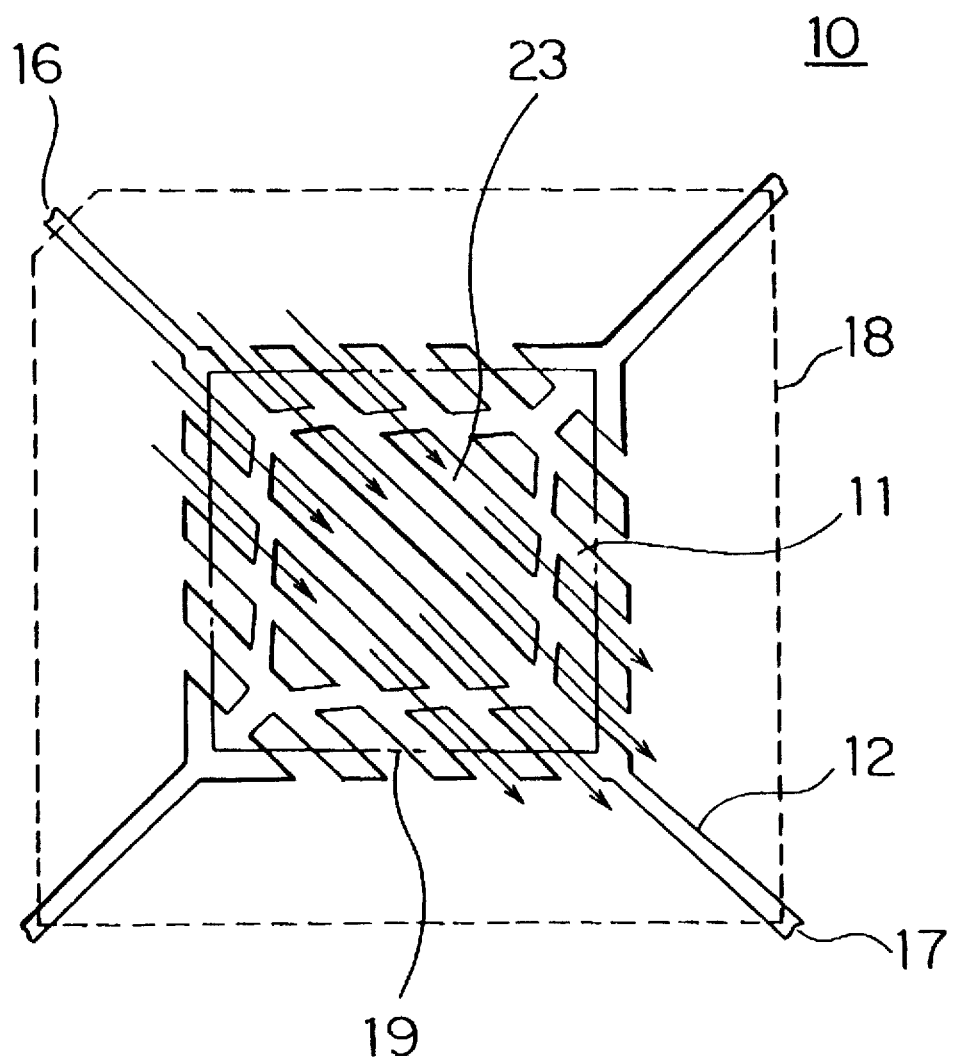
FIG. 5 is a bottom view of the die pad of the lead frame shown in FIG. 4.

FIG. 5 shows resin-flows during encapsulation of a semiconductor device including the lead frame of FIG. 4. When resin encapsulation is carried out for a semiconductor chip 19 mounted on the die pad 11 of the lead frame 10, the resin injected through the gate 16 located at a corner of the die pad 11 flows towards the vent 17 located at the corner opposite to the corner of the gate 16, as shown in FIG. 5. By the configuration as described above, the resin under the lower surface of the lead frame 10 can flow along the oblique slits 23 forming an effective flowing space therefor, as indicated by arrows in the drawing. As a result, the flow resistance against the resin flowing under the lead frame 10 can be reduced compared to the case of the conventional lead frame having slits 22 parallel to the sides of the die pad 11.

Due to the function of the oblique slits 23, it is possible to prevent a die pad shift caused by an unbalance between the resin-flows along the upper surface of the lead frame 10 and along the lower surface of the lead frame 10. In addition, the smooth flow of resin prevents unfilling of resin and generation of resin voids. As a result, a highly reliable resin encapsulated semiconductor device can be obtained. In particular, when the lead frame of the present invention is applied to a thinner type resin encapsulated semiconductor device having a resin thickness of as low as 1.4 mm or less, a remarkable effect can be obtained therein.

Since above embodiment is described only for an example, the present invention is not limited to such embodiment and it will be obvious for those skilled in the art that various modifications or alterations can be easily made based on the above embodiment within the scope of the present invention.

What is claimed is:

1. A lead frame, for use in a semiconductor device, comprising a frame section and a rectangular pad supported by said frame section at each apex of said die pad by a suspension arm extending parallel to a diagonal line of said die pad, for fixing a semiconductor chip on said die pad, said die pad having a plurality of oblique slits therein, substantially all of said oblique slits of said die pad extending parallel to one another and parallel to said suspension arm extending parallel to said diagonal line of said die pad.

2. A lead frame as defined in claim 1 wherein said frame section includes a pair of side portions disposed parallel to each other, said die pad being interposed between said side portions, and a suspension arm, disposed for each four corner of said die pad, for bridging one of said side portions and a corresponding one of said corners of said die pad.

3. A lead frame as defined in claim 2 wherein said lead frame is made of a metallic plate pattern.

* * * * *

UNITED STATES PATENT AND TRADEMARK OFFICE
CERTIFICATE OF CORRECTION

PATENT NO.   : 5,708,294
DATED        : January 13, 1998
INVENTOR(S)  : Keiji Toriyama It is certified that error appears in the above-indentified patent and that said Letters Patent is hereby corrected as shown below:

Claim 1, Col. 6, line 3, after "rectangular" insert --die--

Signed and Sealed this

Twenty-sixth Day of May, 1998

Attest:

BRUCE LEHMAN

Attesting Officer

Commissioner of Patents and Trademarks